(12) United States Patent
Barrett

(10) Patent No.: US 7,472,248 B1
(45) Date of Patent: *Dec. 30, 2008

(54) TECHNIQUES FOR GENERATING SERIAL PRESENCE DETECT CONTENTS

(75) Inventor: Keith E Barrett, Boise, ID (US)

(73) Assignee: Micron Technology, Inc., Boise, ID (US)

(*) Notice: Subject to any disclaimer, the term of this patent is extended or adjusted under 35 U.S.C. 154(b) by 185 days.

This patent is subject to a terminal disclaimer.

(21) Appl. No.: 11/458,053

(22) Filed: Jul. 17, 2006

Related U.S. Application Data

(63) Continuation of application No. 10/782,446, filed on Feb. 19, 2004, now Pat. No. 7,152,139.

(51) Int. Cl.
*G06F 12/00* (2006.01)
(52) U.S. Cl. ..................................... 711/170
(58) Field of Classification Search ............... None
See application file for complete search history.

(56) References Cited

U.S. PATENT DOCUMENTS 5,995,405 A 11/1999 Trick
7,152,139 B1 12/2006 Barrett
2001/0003198 A1 6/2001 Wu
2002/0121920 A1 9/2002 Jolin et al.
2002/0144071 A1 10/2002 Williams et al.
2003/0090879 A1 5/2003 Doblar et al.
2005/0154850 A1 7/2005 Collins

OTHER PUBLICATIONS

"Appendix D: DDR Synchronous DRAM (DDR SDRAM)", *JEDEC Standard No. 21-2*, Release 11,(Unknown),41.2.4-1-4.1.2.4-36, no date.
Yip, Gary, et al., "Rambus SPD Assembler Revision 1.0", *Rambus SPD Assembler Worksheet Revision 1.3*, TL-0001-130, (Sep. 2002), 13 pgs.

*Primary Examiner*—Hiep T Nguyen
(74) *Attorney, Agent, or Firm*—Schwegman, Lundberg & Woessner, P.A.

(57) ABSTRACT

Techniques are presented for automatically generating Serial Presence Detect (SPD) contents. Standards for specific values associated with SPD contents are electronically represented with SPD tokens and rules. When a memory module is identified, a string of needed SPD tokens are acquired for that memory module. The SPD tokens are searched for in the standards and specific SPD values are assembled for the memory module based on the defined rules. The resulting SPD values which are associated with the rules form the needed SPD contents for the memory module. The SPD contents are used to configure an Electrically Erasable Programmable Read-Only Memory (EEPROM) on a memory module.

22 Claims, 10 Drawing Sheets

TECHNIQUES FOR GENERATING SERIAL PRESENCE DETECT CONTENTS

RELATED APPLICATIONS

This application is a Continuation of U.S. application Ser. No. 10/782,446, filed Feb. 19, 2004, which is incorporated herein by reference.

FIELD OF THE INVENTION

The invention relates generally to memory fabrication, and in particular to techniques for generating Serial Presence Detect (SPD) contents in desired formats.

BACKGROUND OF THE INVENTION

Electrically Erasable Programmable Read-Only Memory (EEPROM) is a user modifiable Read Only Memory (ROM) that can be written to repeatedly through applications with higher than normal electrical voltage. Unlike Erasable Programmable Read-Only Memory (EPROM), EEPROM does not need to be removed from a computing device to be modified.

A single type and vendor specific memory module is defined within an EEPROM, via a Serial Presence Detect (SPD) data structure. A single memory module can define a variety of types of memory, such as Dynamic Random Access Memory (DRAM), Static Random Access Memory (SRAM), Synchronous DRAM (SDRAM), Double Data Rate SDRAM (DDR SDRAM), Magnetoresistive Random Access Memory (MRAM), flash memory, image memory, and other types of memory.

In order for a memory module to properly configure itself within a computing device at start up or boot up, a number of configuration attributes associated with that memory module must be defined in the EEPROM on a memory module via the SPD data structure. However, each type of vendor specific memory module can include a variety of physical and performance characteristics associated with a plurality of needed memory components.

Thus, in order to permit interoperability between varying types of vendor specific memory modules to be automatically operational and configured within a variety of disparate computing devices and platforms, the memory industry formed committees within the Joint Electron Device Engineering Council (JEDEC) with the intent of standardizing the structure and contents of the SPD data structure of an EEPROM on a memory module.

Presently, the SPD data structure is defined as a string of 256 bytes, each byte representing a particular configuration component. Some bytes are required; other bytes are optional and provide for better descriptions and information that may be useful in resolving error conditions. For each byte a variety of selectable values can be defined in hexadecimal according to rules associated with the SPD contents, which JEDEC has defined.

The standardization of the format and content of the SPD data structure for EEPROMs on memory modules has had its intended effect of permitting a variety of vendors with a variety of memory modules to automatically integrate into a plurality of disparate computing devices and environments. However, the process of generating a particular instance of SPD contents for an SPD data structure remains problematic.

This is so, because the process of generating needed instances of SPD contents remains largely a manual process fraught with time delays and errors in the industry. Typically, when a particular instance of SPD contents is needed for a particular EEPROM on a memory module a variety of internal groups of a particular vendor will assist in defining their needed components within the SPD contents. Each group will manually inspect the SPD industry standards to resolve their needed SPD values and the location within the SPD data structure where their contents are to be placed. When the entire needed SPD contents are defined, still other groups serve as quality assurance and testing to ensure no manual errors or incorrect values were produced. The entire process involves multiple individual resources and remains primarily manual. Consequently, it is not uncommon for EEPROMs on memory modules to ship with errors that were still undetected or to ship with significant production delays due in large part to the manual process used to create the needed SPD contents.

Therefore there is a need for improved and automated techniques for generating SPD contents for EEPROM on memory modules.

BRIEF DESCRIPTION OF THE FIGS.

DETAILED DESCRIPTION

Figure 1:
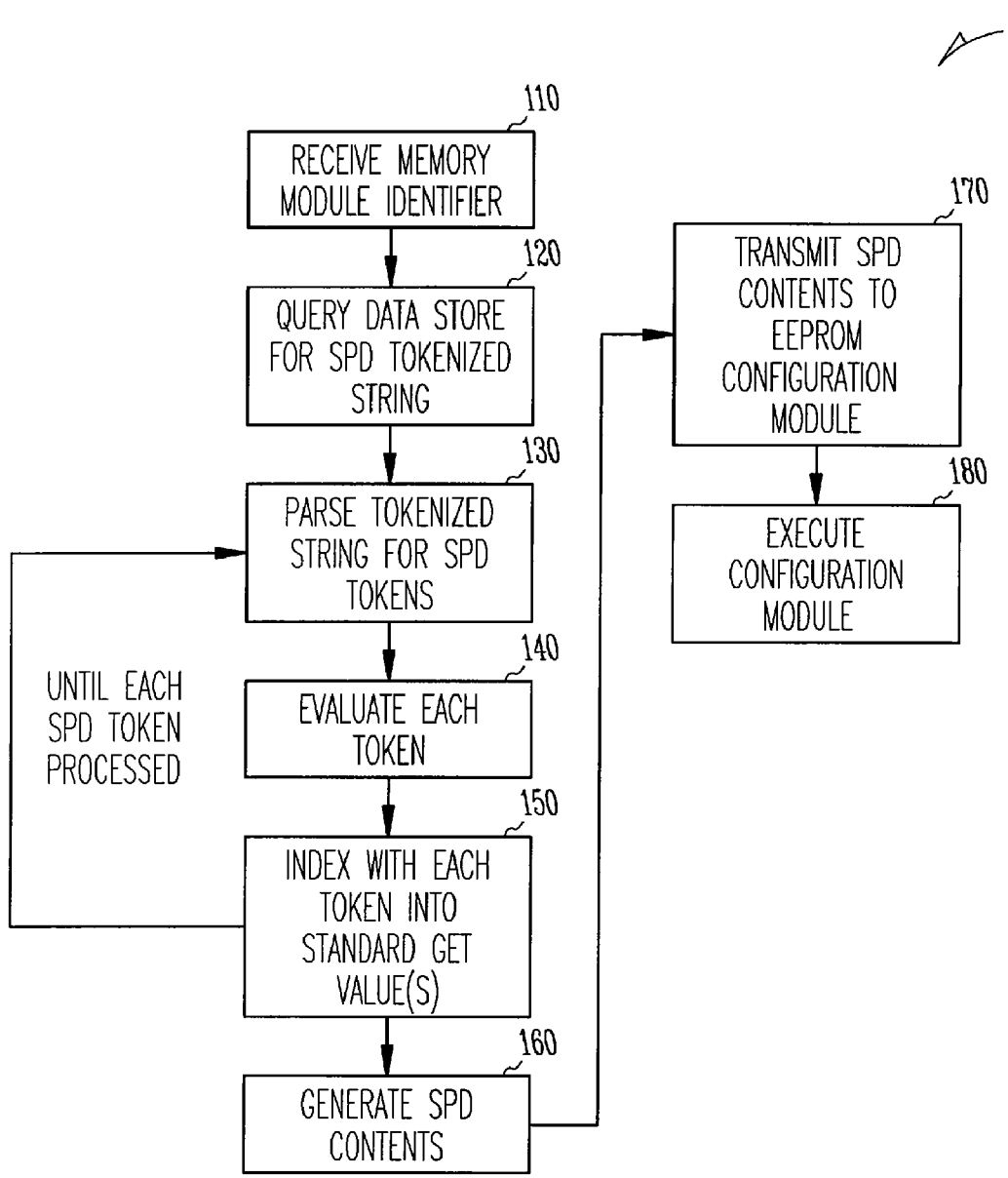
FIG. 1 is a flow diagram of a method for generating SPD contents.

FIG. 1 is a flowchart of one method 100 for generating Serial Presence Detect (SPD) contents. The method 100 (hereinafter "processing") is implemented in a computer accessible medium as one or more software applications, systems, or services. In some embodiments, the processing is accessible over a network. In one embodiment, the processing is at least partially implemented in one or more interfaces that interact with an engineer who is defining SPD contents for an EEPROM module for a given memory module being represented in that EEPROM module. However, it is to be understood that SPD contents can be generated with the various embodiments of this invention for an EEPROM that is on or off a memory module. Thus, hereinafter the term "EEPROM" refers to EEPROMs that are on or off a memory module.

Initially, an environment that is conducive to the processing is established. This environment includes an electronic representation of an industry standard for generating SPD contents. As one example the JEDEC standard for SPD contents is codified in a computer-accessible environment. This standard includes definitions for each byte and available byte values of an SPD data structure based on a variety of variables. Some of these variables include the type of memory module (DRAM, SDRAM, DDR SDRAM, etc.) being defined in the SPD data structure, the vendor supplying the memory module (e.g., MICRON, etc.), the number of components associated with the memory module, the physical dimensions of the memory module or components (e.g., height, width, depth), the memory module version number, the processing speed of the memory module or components, the type of packaging and dies used with the memory module, the die revision number, and the printed circuit revision designator and low-profile designator, and others. Not all variables may be used within a particular session with the processing, but all available variables in the standard are in a codified format, such that each variable needed to resolve a byte location and byte value for any particular permutation of an SPD data structure instance is available within the codified format.

Moreover, although present standards envision an SPD data structure having 256 bytes, the embodiments of the invention are not intended to be so limiting. In fact, any standard that now exist or exists in the future can be codified and used in the novel manners presented with embodiments of this invention.

In addition, each variable defining a particular byte location within the standards can include a plurality of additional sub-dependent variables. The resolution as to which sub-dependent variable to select in a given situation is codified as rules within the standards. Furthermore, each variable or sub-dependent variable is associated with a corresponding acceptable value or list of selectable values which can be included within the SPD contents. All these permutations of acceptable values or list of selectable values are also defined within the codified version of the standards.

The variables and sub-dependent variables are represented as tokens within the codified standards. Each token or sets of certain tokens are associated with the rules which drive selecting a needed SPD value or resolving a needed SPD value from a list of acceptable values.

The tokens defined in the standards are also mapped to available vendors, available memory modules of a specific vendor, and to characteristics and components associated with specific memory modules. These tokens can include token identifiers for easy retrieval and storage. Also, the tokens can be assembled by the processing for an SPD tokenized string. A single instance of a SPD tokenized string includes information necessary to generate SPD contents for a desired memory module.

With this environment established, the processing begins at 110 where a particular memory module identifier is received. Receipt of the memory module identifier can come from an engineer interfacing with processing either directly via a user Application Programming Interface (API) or indirectly via another application that acts as an intermediary for the processing.

Once the memory module identifier is received, a data store is queried at 120 for purposes of acquiring an instance of an SPD tokenized string. The SPD tokenized string includes a plurality of SPD tokens. These SPD tokens represent variables and/or sub-dependent variables represented in the codified version of the standards for generating SPD contents. The SPD tokenized string includes enough SPD tokens necessary to generate a valid instance of SPD contents for the received memory module identifier. In some cases, this means all 256 available SPD data structure bytes are represented by one or more SPD tokens. In other cases, this means that less than all 256 bytes are represented under circumstances where not all SPD data structure bytes are needed to generate a valid SPD contents for the received memory module identifier. In yet other cases, more than 256 SPD data structure bytes are represented with one or more SPD tokens.

At 130, the processing parses the SPD tokenized string to acquire each of the embedded SPD tokens. As each token is acquired from the SPD tokenized string, at 140, the acquired token is evaluated via of the codified version of the standards. In one embodiment, this means the codified version of the standards is indexed into with each acquired token at 150 in order to acquire needed SPD values for that particular token. This can entail enforcing rules associated with any particular token, such that dependencies are required before that particular token can be present. In other words, some tokens may require that another token be present before the presence of those tokens is permissible (e.g., sub-dependent variables). As another example, a rule may state that a particular token being evaluated also include two or more sub-dependent variables for proper resolution.

The processing of parsing and evaluating the acquired tokens from the SPD tokenized string continues back at 130 and iterates until each token within tokenized string has been evaluated. During each iteration of the loop, specific needed SPD values are being resolved by the evaluation. In some cases, some values are resolved after all of the tokens are evaluated. In either case, upon the conclusion of evaluating each of the tokens, a specific instance of SPD contents is generated at 160. This generated SPD contents represents byte values contained in the proper byte locations to populate an SPD data structure in order to properly configure a memory module associated with the memory module identifier within an EEPROM.

Thus, in some embodiments, at 170, the generated SPD contents are transmitted to an EEPROM configuration module. The EEPROM configuration module, when executed at 180, writes or configures the SPD contents within an EEPROM. That EEPROM can now be shipped for installation within a computing or processing device, or that EEPROM can now be directly installed within a computing or processing device.

The embodiments presented with the processing of FIG. 1 permit specific instances of SPD contents to be automatically generated and configured into a needed instances of an SPD data structure. Conventionally, this entire process has been a manual one fraught with development delays and errors. However, the teachings presented herein create an automatic process and removes any errors that can be introduced from the manual creation of SPD contents. As a result, SPD contents are more timely generated and have improved quality with the embodiments of this invention.

Figure 2:
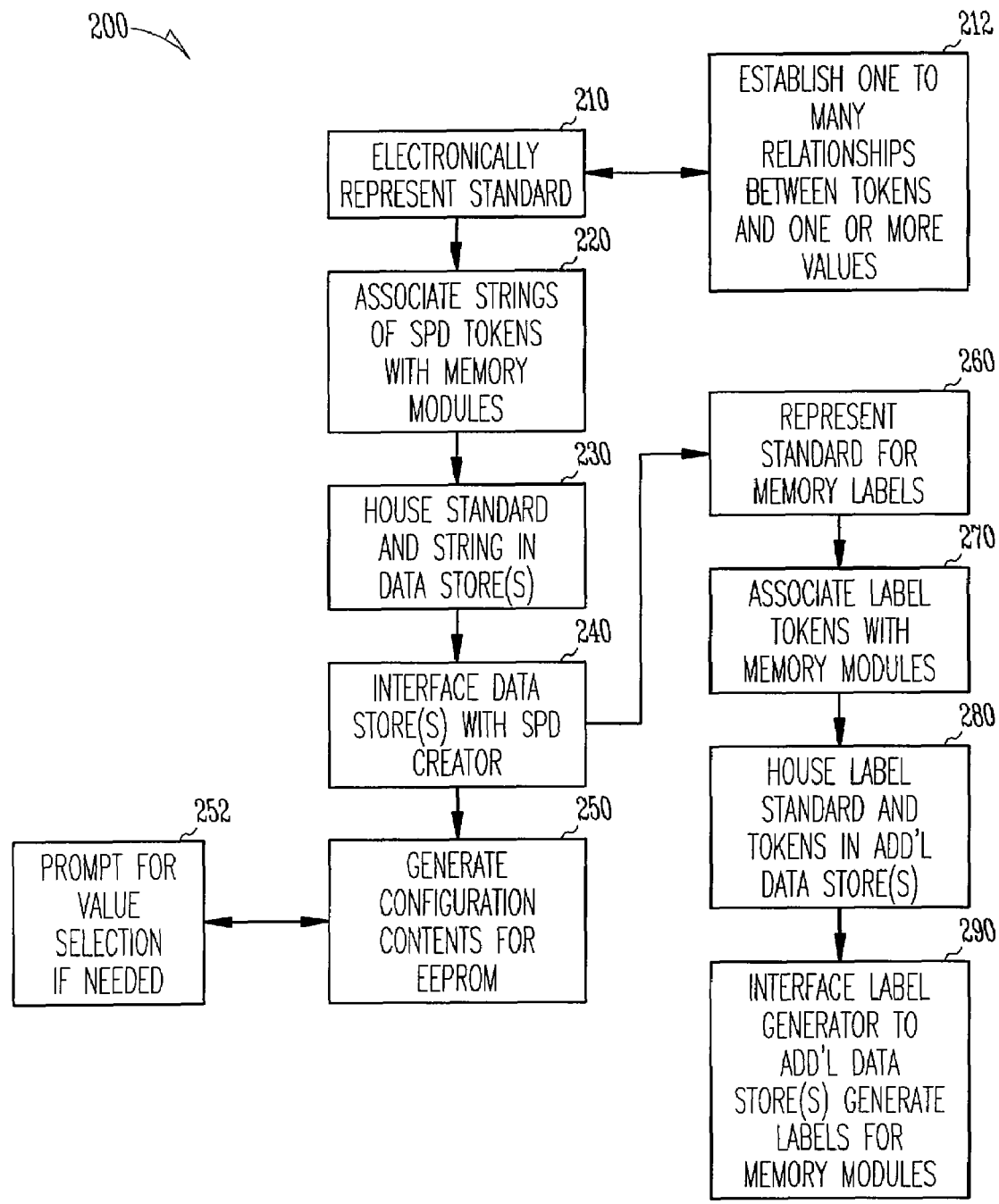
FIG. 2 is a flow diagram of a method for SPD contents fabrication.

FIG. 2 is a flowchart of one method 200 for fabricating the contents of SPD contents. The method 200 is implemented in a computer-readable and accessible medium. In some embodiments the method 200 is accessible over a network. Moreover, the processing of the method 200 creates an environment which can be consumed by the method 100 presented above with FIG. 1.

At 210, an industry standard for generating SPD contents is codified in an interpretable electronic format. The industry standard is represented as a series of SPD tokens, sub-dependent tokens, values, and rules. The rules drive the dependencies between the tokens and values. In some embodiments, at 212, a single SPD token or single sub-dependent token can have a one to many relationship with one or more values. That is, a token may be associated with a rule that states a variety of selectable SPD values are acceptable for this particular token.

At 220, a selective number of the SPD tokens and sub-dependent tokens are also associated with vendor specific memory modules. This can be done by grouping sets of selective tokens into SPD tokenized strings for memory modules identified by memory module identifiers. In some embodiments, vendor identifiers can also be used, such that the association at 220 is first dependent upon a specific vendor. In other embodiments, the memory module identifiers are pre-established based on specific unique vendors.

At 230, the codified version of the industry standard along with the SPD tokens, SPD sub-dependent tokens, values, and rules are housed in one or more searchable data stores. In some embodiments, the data stores are relational databases, object oriented databases or electronic files having APIs which permit the tokens, values, and rules to be indexed into the electronic files and retrieved from the electronic files based on searches conducted through the APIs.

Once, the industry standard is codified and housed in the one or more data stores and the SPD tokens associated with memory modules, at 240, the one or more data stores are interfaced with a SPD content creator. In one embodiment, the SPD content creator performs the processing defined with method 100 of FIG. 1 above. The SPD content creator generates instances of specific SPD contents based on supplied memory module identifiers. A particular SPD contents is used as the configuration contents for a needed SPD data structure that is to populate an EEPROM for a given memory module.

At 250, the SPD content generator can be processed for a given memory module for purposes of generating configuration contents (e.g., SPD contents). Since, the SPD content generator is interfaced to the one or more data stores, it generates a tokenized string for a given memory module and interacts with the data stores to acquire rules and values defined in the industry standard for each of the tokens contained in the tokenized string. In some embodiments, during evaluation of any particular token and associated rule there can be a one to many relationship between the rule and one or more available and acceptable values (as was discussed above with respect to block 212). In these situations, the SPD content creator can be preconfigured to automatically select one of the many acceptable values, can be configured to evaluate metadata to automatically select one of the many acceptable values, or can, at 250, manually prompt a user to manually select one of the many acceptable values.

In still other embodiments of the method 200, the process associated with generating industry standard labels for any generated EEPROM that includes generated SPD contents for a particular memory module can also be automated with techniques similar to what has been discussed herein. For example, at 260, standards associated with memory labels can be electronically codified and represented. At 270, label tokens and/or rules associated with the label standards can be associated with memory modules. These tokens, rules, values associated with the tokens and rules can be stored in one or more additional data stores at 280. A label generator can then be interfaced to the one or more additional data stores at 290. The label generator performs processing similar to the SPD content creator only against the label tokens, the label rules, and label values of the one or more additional data stores. Accordingly, the label generator can be used to automatically generate industry required labels for the memory modules defined in EEPROMs.

The embodiments of method 200 teach how a fabrication environment can be established which permits the automatic generation of SPD contents when needed. Additionally, the fabrication environment can be extended to include the automatic generation of label information needed for memory modules.

Figure 3:
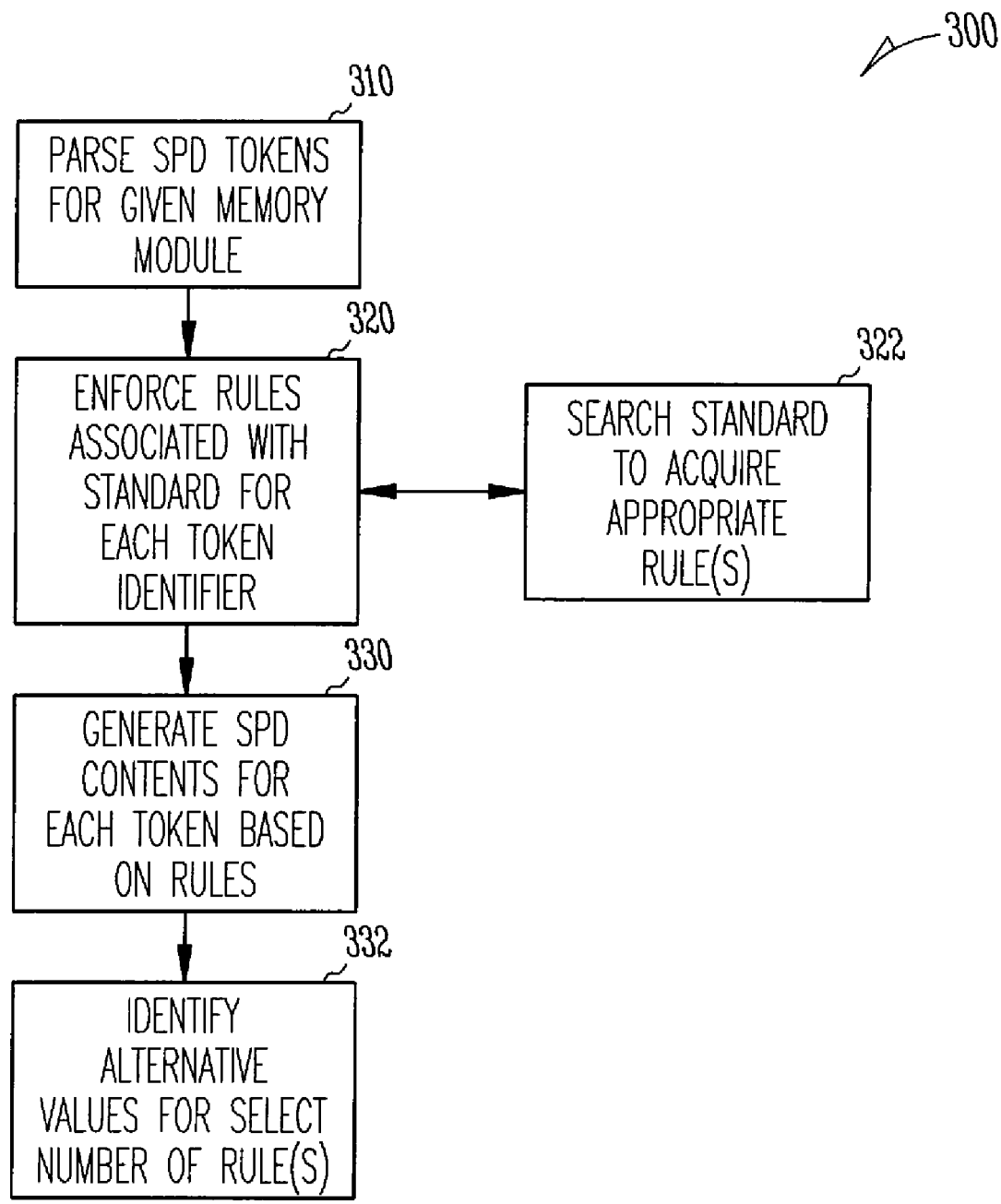
FIG. 3 is a flow diagram of another method for generating SPD contents.

FIG. 3 is a flowchart of another method 300 for generating SPD contents. The method 300 is implemented in a computer-readable and accessible medium. In some embodiments, the method 300 is accessible over any network. The processing of the method 300 (hereinafter "processing") is an alternative processing to that which was described above with method 100 of FIG. 1. Moreover, in some embodiments, the processing uses the fabrication environment established by the method 200 of FIG. 2. In these latter embodiments, the processing can be viewed as embodying in whole or in part some of the capabilities of a SPD content creator presented in FIG. 2.

At 310, SPD tokens are parsed from an SPD tokenized string for a given memory module. The SPD tokens represent variables and sub-dependent variables defined in a codified version of an industry standard for generating SPD contents. Moreover, each of the SPD tokens is associated with one or more rules defined in that industry standard.

As each of the SPD tokens are acquired from the parsing of 310, rules are identified for that acquired SPD token. The rules are identified by token identifiers that uniquely identify the SPD tokens within the industry standard. At 320, the rules are enforced for each acquired token in order to acquire a specific SPD value or set of available SPD values. At 322, and in some embodiments, the rules can be acquired by searching a data store with a token identifier. The data store includes the codified version of the industry standard.

After each token is evaluated and values acquired for each token that requires a value, the processing generates SPD contents for each token at 330. During the processing, the acquired values can be populated or concatenated to an instance of an SPD data structure or alternatively all the acquired values can be held until processing completes and then organized into their proper locations within an instance of an SPD data structure.

When more than a single SPD value can be provided for a given token that is being evaluated, at 332, the processing can be configured to automatically select a particular one of the values based on a preconfigured preference, based on evaluation of other metadata, or based on manually inputted selection to the processing.

Once an instance of the SPD contents is completely generated and populated to an instance of an SPD data structure, the SPD contents can be configured or written to an EEPROM. The generated SPD contents represents the needed value configuration of an SPD data structure for the given memory module that is needed according to the industry standards for an EEPROM.

Figure 4:
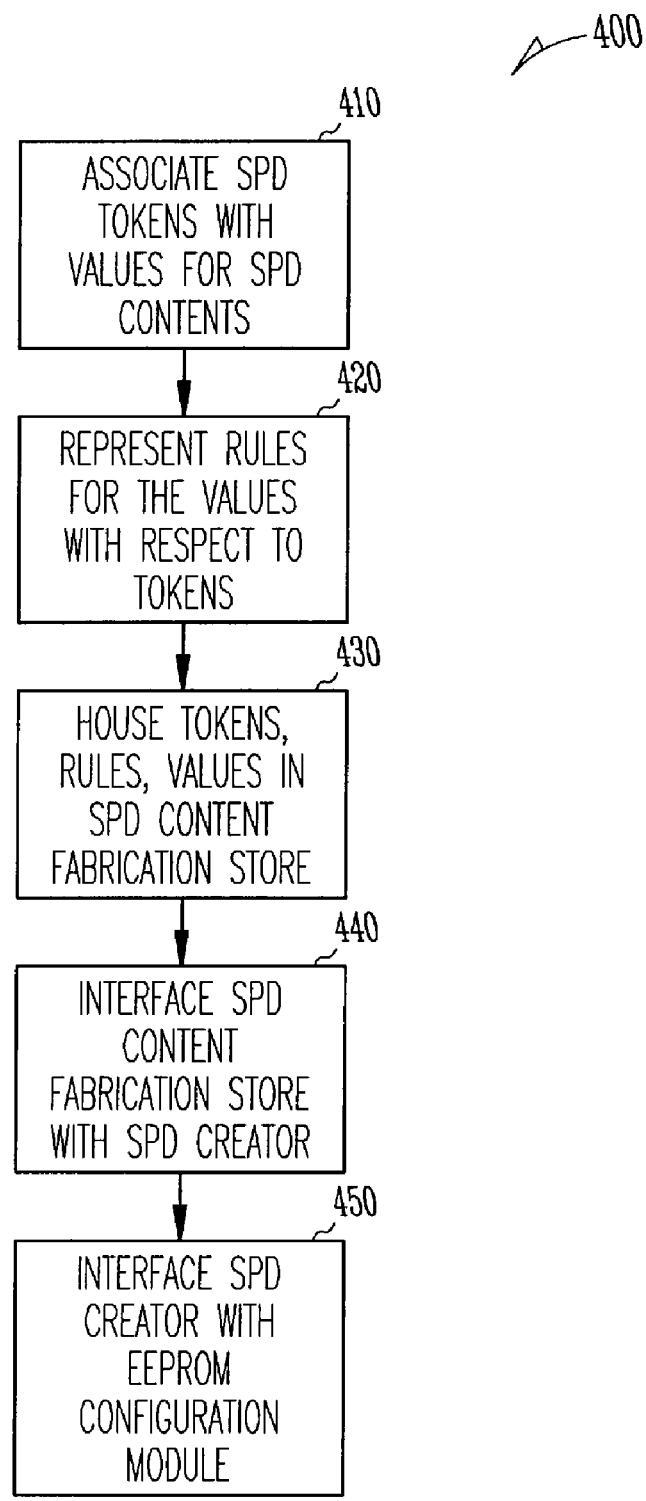
FIG. 4 is a flow diagram of a method for generating a SPD content fabrication data store.

FIG. 4 is a flowchart of method 400 for generating or populating a SPD content fabrication data store. The method 400 is implemented in a computer-readable and accessible medium. In some embodiments, the method 400 is accessible over any network. In one embodiment, the processing of the method 400 represents a portion of the processing depicted in method 200. That portion is the components that populate the one or more data stores described in FIG. 2 and in the method 200.

Initially, an industry standard for generating SPD contents is evaluated for purposes of identifying variables and sub-dependent variables that are permissibly defined and available in the industry standard. These variables are represented as SPD tokens. Permissible values associated with the variables define SPD contents. The values are also defined in the standards.

At 410, SPD tokens are electronically associated (e.g., linked or mapped) with their appropriate values as defined in the industry standard. Rules associated with selecting particular values or associated with dependent relationships between various tokens are electronically represented at 420 based on the industry standard. Next, at 430, the SPD tokens, values, and rules are housed or populated within a SPD content fabrication data store.

The fabrication data store is now in condition to be queried and consumed by a SPD content creator. The SPD content creator generates specific instances of SPD contents for given memory modules. Some example SPD content creator processing is provided above with respect to FIGS. 1-3. Accordingly, once the fabrication data store is populated at 440, a SPD content creator is interfaced to an API of that data store. In some embodiments, the SPD content creator is also interfaced to an EEPROM configuration module at 450. An EEPROM configuration module is capable of receiving SPD contents for a given memory module and configuring or writing a needed instance of a SPD data structure to an EEPROM.

The embodiments of the method 400 describe how an industry standard for generating SPD contents can be electronically codified within a SPD content fabrication data store. This fabrication data store further facilitates and automates the automatic generation or SPD contents performed by SPD content creators for given memory modules.

Figure 5:
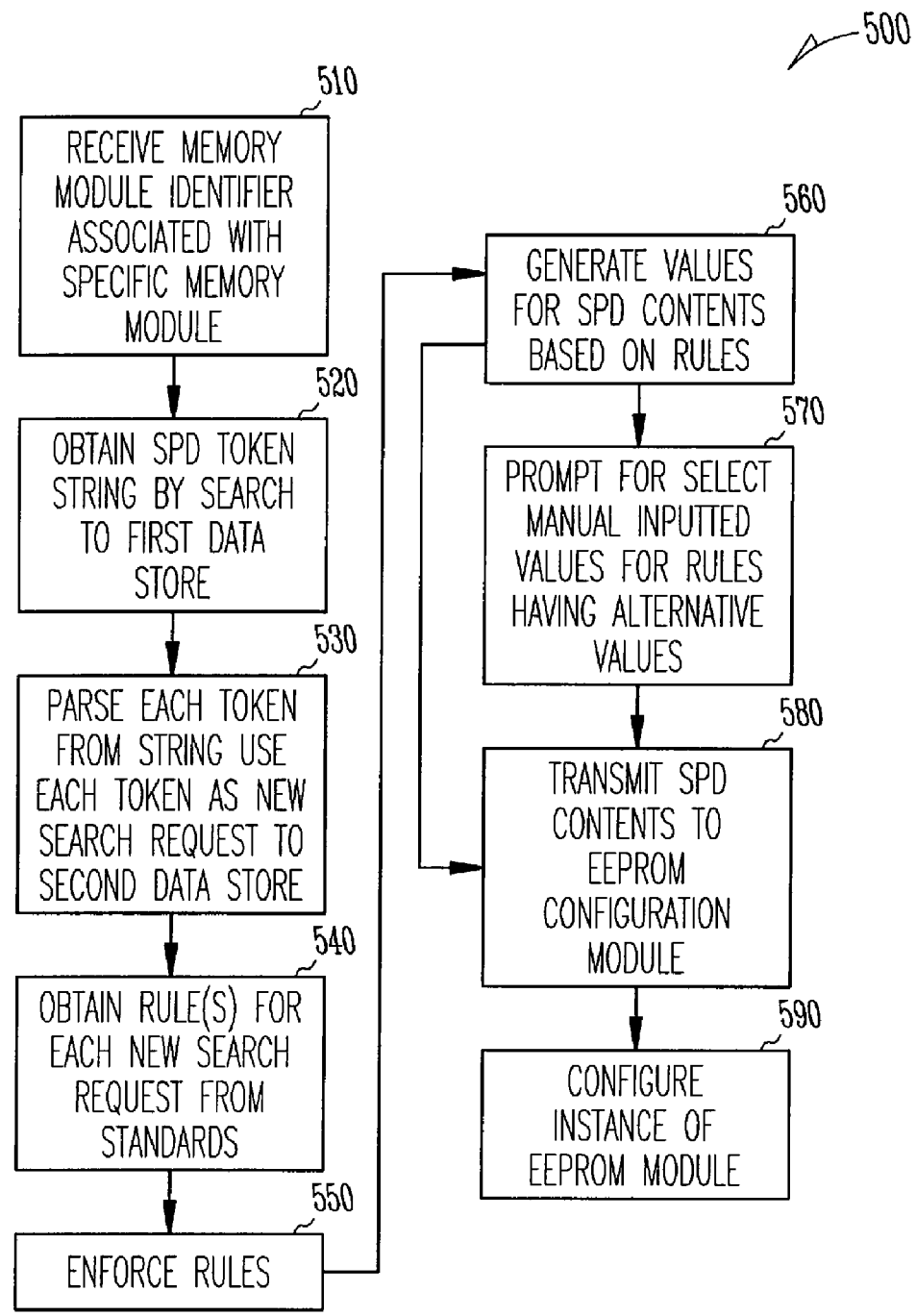
FIG. 5 is a flow diagram of a method for generating SPD contents for an EEPROM module.

FIG. 5 is a flowchart of one method 500 for generating SPD contents for an EEPROM. The method 500 is implemented in a computer-readable and accessible medium. In some embodiments, the method 500 is accessible over a network. The processing of method 500 depicts a processing example of automatically generating SPD contents for a given memory module, where that generated SPD contents is written to or configured in an EEPROM.

Initially, at 510, a memory module identifier associated with a specific type of memory module is received. In some embodiments, the memory module identifier is received from an interface that interacts with a user. The user desires to produce the appropriate SPD contents for a memory module for purposes of writing or configuring the SPD contents into an EEPROM. The EEPROM will contain configuration data which can dynamically configure a processing device with the appropriate configuration and locations of the proper memory module components when the device is initialized at start up or boot up. In other embodiments, a specific memory module identifier is received from a service or automated application that may serially interact with the processing of 500 for purposes of generating several different SPD contents for several different memory modules.

At 520, the processing of the method 500 obtains a SPD token string that represents a plurality of needed SPD tokens for the memory module. The SPD token string is obtained by issuing a search request to a first data store with the search operand being the memory module identifier. As previously discussed in detail, an SPD token represents a variable parameter or variable sub-dependent parameter defined in an electronic version of an industry standard for generating SPD contents for EEPROMs. Each SPD token is associated with one or more rules and one or more specific SPD values. The SPD values represent specific byte values for a SPD data structure.

After the SPD token string is obtained for the memory module identifier from the first data store, the SPD token string is parsed for each unique SPD token included therein at 530. Also, at 530, each SPD token is used as a separate search request into a second data store in order to obtain rules and values associated with each SPD token. The second data store includes a codified electronic version of the industry standard in a searchable format. Thus, at 540, rules and values are obtained as results of the searches for each of the SPD tokens contained in the SPD token string.

At 550, the rules are enforced. That is the rules are processed based on the identities of the SPD tokens and based on logic that is driven by the rules. Next, at 560, by enforcing the rules specific SPD values are obtained for an instance of a SPD data structure. In some embodiments, at 570, a number of the rules during enforcement or interpretation may indicate that there is more than one available and acceptable value for a particular SPD token. In these instances, the processing of 500 may prompt a user interface to provide manually inputted values which are selected from a list of available values defined by the rules. In other instances, there is no prompting when more than one value is permissible, rather, the processing of the method 500 is preconfigured to determine or resolve a preferred or desired value selection based on predefined preferences or based on evaluation of other metadata.

At 580, and in one embodiment, the generated SPD contents for the memory module are transmitted to an EEPROM configuration module. The EEPROM configuration module configures or writes an instance of a SPD data structure which has the generated SPD contents to an EEPROM. Correspondingly, at 590, an instance of an EEPROM is automatically configured with the generated SPD contents.

The processing of the method 500 demonstrates how automated processing can be implemented to generate SPD contents for a desired type of memory module. Conventionally, this processing was manual and fraught with manually introduced errors. The processing of the method 500 corrects these conventional shortcomings.

Figure 6:
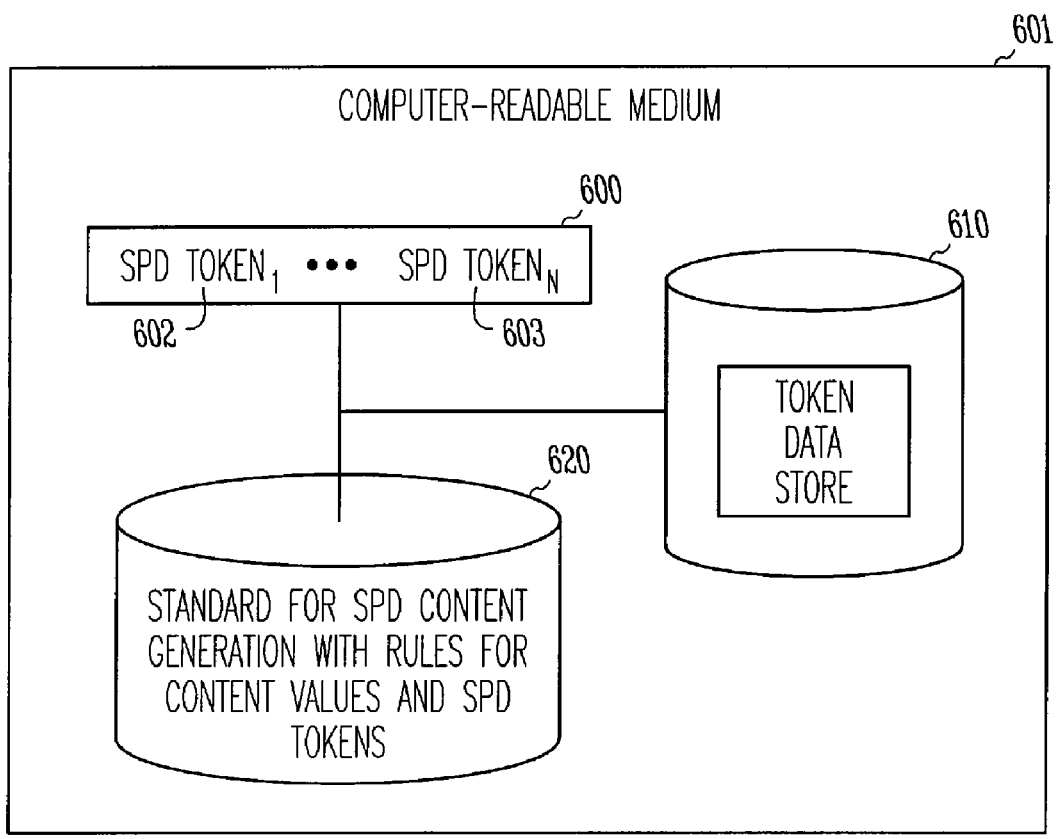
FIG. 6 is a diagram of a SPD data structure.

FIG. 6 is a diagram of one SPD data structure 600. The SPD data structure 600 is implemented in a computer-readable and accessible medium 601. The SPD data structure 600 is used or consumed for purposes of assisting in the automatic fabrication of SPD contents for EEPROMs. In one embodiment, the SPD data structure is consumed by the processing described above with respect to FIGS. 1-5.

The SPD data structure 600 includes a plurality of SPD tokens 602 and 603. An SPD token 602 or 603 logically and electronically represents variable parameters defined in an industry standard for generating SPD contents for SPD data structures. Each SPD token 602 or 603 is associated with one or more logical rules or dictates, which are associated with the industry standard. Interpretation or enforcement of the rules for a particular SPD token 602 or 603 yields an SPD value or a list of available and acceptable SPD values. The SPD values are byte values for the SPD data structure and when assembled in the correct format from an instance of a SPD data structure. That instance defines a particular memory module for an EEPROM. The EEPROM is interpreted during start up or boot up of a processing device having the EEPROM in order to properly configure and initiate the memory module.

Each instance of the SPD data structure 600 forms a particular SPD token string. That is based on the identity of a particular memory module, the types of SPD tokens 602 and 603 will vary within the SPD data structure 600. The SPD token string is formed by concatenating select ones of the SPD tokens 602 and 603 together. In some embodiments, an exact ordering of the SPD tokens 602 and 603 is not required. This is so, because each SPD token 602 or 603 is unique, such that any particular SPD token 602 or 603 within the SPD data structure 600 can be resolved by processing that consumes or parses the SPD data structure 600. In other embodiments, for purposes of processing efficiency the SPD data structure 600, the SPD tokens 602 or 603 are arranged in a predefined order based on identifiers associated with the SPD tokens 602 and 603.

In one embodiment, instances of the SPD data structure 600 are predefined and stored in an SPD token string data store 610. Each instance represents need SPD tokens 602 and 603 for a specific type of memory module. The SPD tokens 602 and 603 are also individually represented within data store 620 that electronically codifies the standard for generating SPD contents for EEPROMs.

In one embodiment, the data format of the SPD data structure 600 is in an Extensible Markup Language (XML) format. This permits the SPD data structure 600 to be interpreted and processed in an automated fashion through use of schemas and translation programs that can dynamically interpret the schemas and parse the SPD data structure 600 for the individual SPD tokens 602 and 603. Thus, in embodiments where the SPD data structure 600 is in an XML format no specialized processing is needed or need be developed to parse the SPD tokens 602 and 603, all that is needed is an XML schema that defines the SPD data structure 600 and conventionally available translation programs can then be used to automatically parse the SPD tokens 602 and 603. This is beneficial because should SPD tokens 602 and 603 be added, changed or removed no changes will need to be made to programs that parse the SPD tokens 602 and 603. Moreover, if the SPD data structure 600 is in an XML format the SPD data structure 600 can be seamlessly and dynamically communicated to other services or applications which can immediately process the SPD data structure 600 using the XML schema. Of course, no particular SPD data structure 600 format is needed for the teachings of this invention. Therefore, the format of the SPD data structure 600 is not intended to be limited to any particular data format.

The SPD data structure 600 permits more efficient processing for automatically fabricating the SPD contents for desired memory modules within an EEPROM. In some embodiments, the SPD data structure 600 is consumed by the processing described above with FIGS. 1-5.

Figure 7:
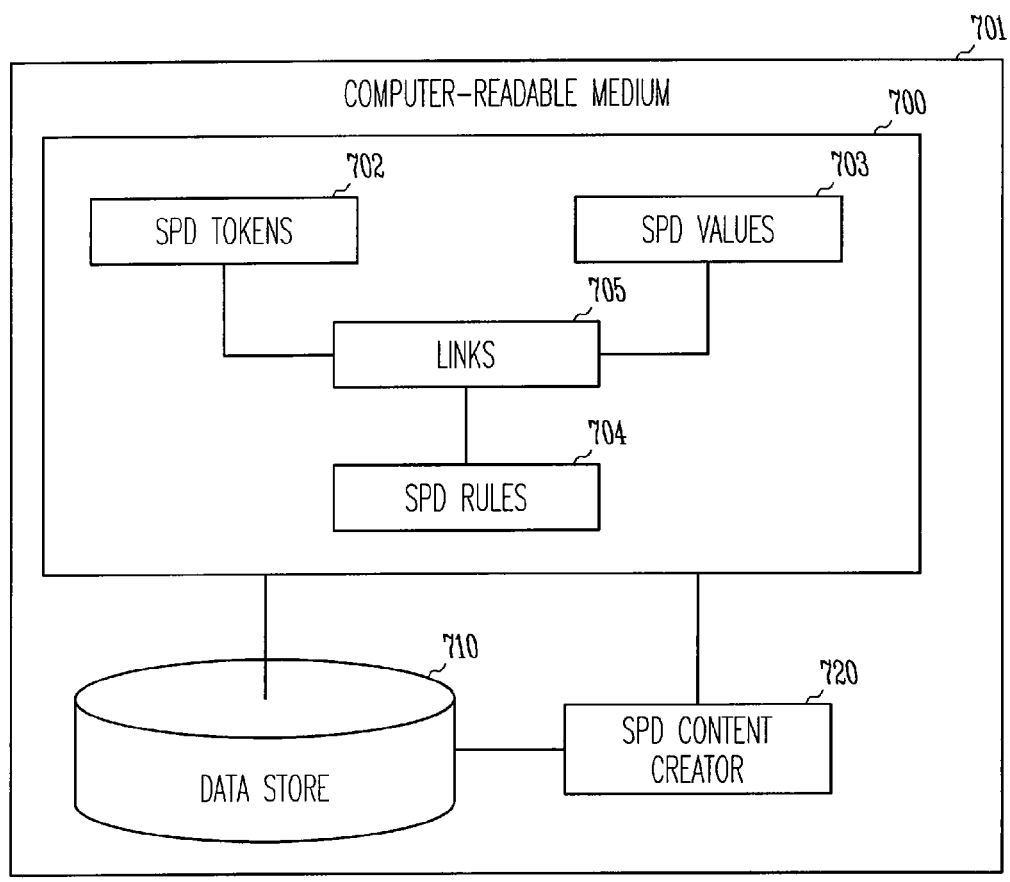
FIG. 7 is a diagram of another SPD data structure.

FIG. 7 is a diagram of another SPD data structure 700. The SPD data structure 700 is implemented in a computer-readable and accessible medium 701 and in some embodiments is accessible over any network. The SPD data structure 700 is consumed by processes that automatically generate SPD contents for EEPROMs according to the directives of an industry standard for generating SPD contents, such as processes defined above with respect to FIGS. 1-5. Moreover, the SPD data structure 700 can be used in combination or in isolation with the SPD data structure 600 described above with respect to FIG. 6. The SPD data structure 700 provides one example of how an industry standard for generating SPD contents can be electronically codified in an efficient and usable electronic format.

The SPD data structure 700 includes a plurality of SPD tokens 702, a plurality of SPD values 703, a plurality of rules 704, and a plurality of links 705. The SPD tokens 702 map to specific variable parameters or sub-dependent variable parameters defined in an industry standard for generating SPD contents. Similarly, the SPD values 703 are associated with the SPD tokens 702 and represent specific acceptable SPD content value assignments defined in the standard. Moreover, the SPD rules 704 define processing directives or requirements for particular SPD tokens 702 vis-à-vis particular SPD values 703. The links 705 define the proper dependencies between the SPD tokens 702, the SPD values 703, and the SPD rules 704.

The SPD data structure 700 is consumed by processing to automatically generate SPD contents. Each instance of the SPD data structure can represent a standard for which contents are derived based on parameters and rules. Thus, the SPD data structure 700 can be used with other standards, such as a standard for automatically conforming labeling information is associated with a particular type of memory module. In some embodiments, the SPD data structure 700 is indexed and housed in a data store 710. In other cases, the SPD data structure 700 is dynamically generated and housed in memory during processing that automatically generates SPD contents.

In one embodiment, an SPD content creator 720 consumes the SPD data structure 700 for purposes of generating instances of SPD contents for EEPROMs. The SPD data structure 700 may be predefined and available to the SPD content creator 720 in the data store 710, or the SPD content creator 720, or some other process, may automatically generate the SPD data structure 700 based on a given SPD industry standard for generating SPD contents. The SPD content creator 720 can use the SPD data structure 700 in combination with the SPD data structure 600 in order to acquire a SPD tokenized sting (SPD data structure 600) for a given memory module, locate the individual tokens within the available SPD tokens 702 for purposes of acquiring the needed links 705; the links 705 provided the associated SPD values 703, and the associated SPD rules 705. The SPD content creator 720 then evaluates or interprets the linked SPD rules 704 for purposes of acquiring the needed SPD values 703 needed for automatically generating SPD contents.

In one embodiment, the SPD data structure 700 is populated initially with the processing defined above with method 200 or method 400 of FIGS. 2 and 4, respectively. The SPD data structure 700 then provides the proper initial environment for the processing of methods 100, 300, and 500 of FIGS. 1, 3, and 5, respectively. In some embodiments, for purposes of efficiency, the methods 100, 300, and 500 can also consume and use the SPD data structure 600 of FIG. 6.

Figure 8:
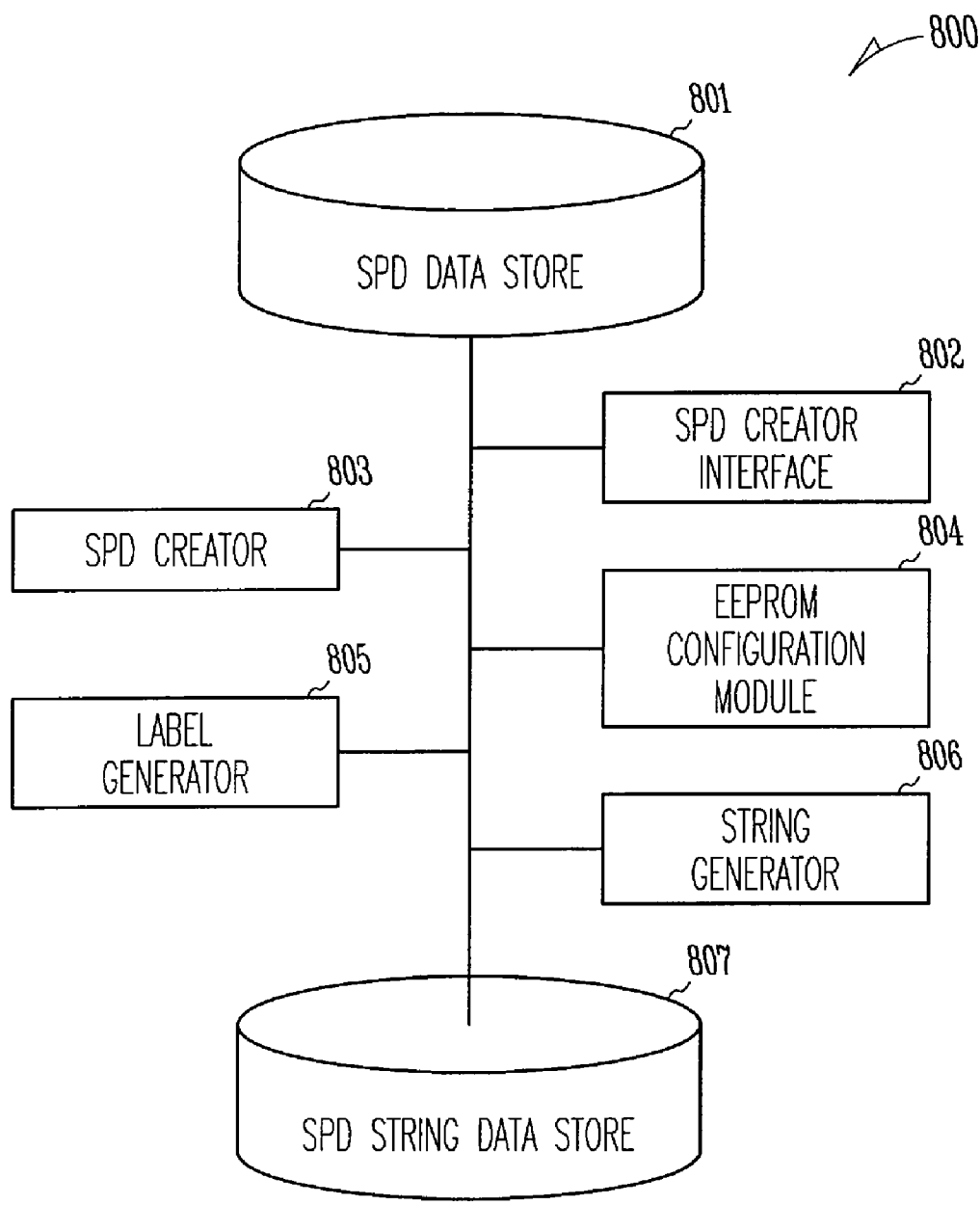
FIG. 8 is a diagram of a SPD content creation system.

FIG. 8 is a diagram of one content creation system 800. The content creation system 800 is implemented in a computer-readable and accessible medium and is accessible over any network. The content creation system 800 need not be operational, but when it is in operation it provides a service that automatically generates the appropriate SPD contents for a given memory module. The SPD contents can then be automatically or subsequently configured or written to a desired EEPROM.

The content creation system 800 minimally includes a SPD data store 801 and a SPD creator 803. In one embodiment, the content creation system 800 also includes a SPD creator interface 802. However, it is to be understood that the features of the SPD creator interface 802 described herein and below can be embodied in whole within the SPD creator 803. Moreover, in some embodiments, the content creation system 800 also includes one or more of the following an EEPROM configuration module 804, a label generator 805, a string generator 806, and a SPD string data store 807. In one embodiment, the SPD data store 801 includes the SPD data structure 700 of FIG. 7, which is generated by the processing of the methods 200 and 400 of FIGS. 2 and 4, respectively. In another embodiment, the SPD string data store 807 includes the SPD data structure 600 of FIG. 6. In still other embodiments, the processing of the SPD creator 803 is defined by the processing of the methods 100, 300, and 500 of FIGS. 1, 3, and 5, respectively. Moreover, in one embodiment, the processing of the label generator 805 is defined by the processing of method 200 of FIG. 2.

The SPD creator interface 802 is an API which can be interacted with by a user. The SPD creator interface 802 can be implemented in any programming language or within browser pages associated with existing and conventionally available Word-Wide Web (WWW) browser interfaces. The SPD creator interface 802 acts as an intermediary between a user and the SPD creator 803. The user accesses the SPD creator interface 802 for purposes of defining the SPD contents for a user desired memory module. In some embodiments, the SPD creator interface 802 is designed to communicate error conditions occurring with the SPD creator 803 or based on syntax or semantics associated with memory module identifiers and SPD contents.

During operation of the SPD content creation system 800, the SPD creation interface 802 interacts with the user to acquire a memory module identifier that identifies a particular memory module. In some embodiments, the SPD content creation system 800 may require the use to initially enter a vendor identification for a specific vendor before the memory module identifier is supplied by the user.

Next, the SPD creation interface 802 transmits or interacts with the SPD creator 803 to supply the user supplied memory module identifier and/or vendor identifier. In some embodiments, in response to the supplied memory module identifier, the SPD creator contacts the string generator 806 and communicates the memory module identifier. The string generator 806 either generates a SPD tokenized string for the SPD creator 803 or issues a search request to the SPD string data store 807 for purposes of acquiring the SPD tokenized string for the needed memory module. When the needed SPD tokenized string is acquired, it is communicated back to the SPD creator 803. The SPD creator 803 proceeds to parse the SPD tokenized string to acquire each unique SPD token contained therein.

The SPD creator 803 uses each SPD token as a search operand into the SPD data store 801. In response to the search request, the SPD data store returns SPD values and SPD rules that are linked and associated with the search operand (SPD token). These types of searches continue until all SPD tokens are searched for in the SPD data store 801. In one embodiment, the SPD creator 803 issues a single search request that includes all the tokens of the SPD tokenized string and then assembles the search results for processing.

Next, the SPD creator 803 proceeds to evaluate or interpret each of the returned rules vis-à-vis their linked SPD tokens. As the rules are enforced, the SPD creator 803 assembles selected ones of the SPD values necessary for generating the needed SPD contents for the originally user-supplied memory module identifier. Accordingly, after all the rules have been processed, the SPD creator 803 assembles complete SPD contents for the needed memory module.

In one embodiment, the SPD creator 803 can be configured based on a predefined preference of the user to automatically transmit the generated SPD contents for the needed memory module to the EEPROM configuration module 804. In another embodiment, the SPD creator 803 provides the generated SPD contents to the SPD creator interface 802, where it is communicated to the user. The user via the SPD creator interface 802 can then manually direct the SPD creator 803 or the SPD creator interface 802 to transmit the SPD contents to the EEPROM configuration module 804. The EEPROM configuration module 804 then batches the request to configure an EEPROM with the SPD contents or immediately configures an EEPROM with the SPD contents.

In still another embodiment, the SPD content creation system uses a label generator 805 for purposes of acquiring label tokens for a given memory module identifier. The label generator 805 can be contacted or communicated with via the SPD creator interface 802, the SPD creator 803, or another and separate label generator interface (not shown in FIG. 8). The label generator 805 contacts a label store (not shown in FIG. 8) acquires associated rules and values for each of the label tokens associated with the needed memory module and the label generator 805 automatically generate an industry standard label for the needed memory module.

The architectural configuration and layout of FIG. 8 is presented for purposes of illustration and comprehension only and is not intended to limit embodiments of the invention. Correspondingly, features of the components of FIG. 8 can be embedded in additional modules not shown in FIG. 8 or some features of one or more components can be implemented as features in one or more separate components.

Figure 9:
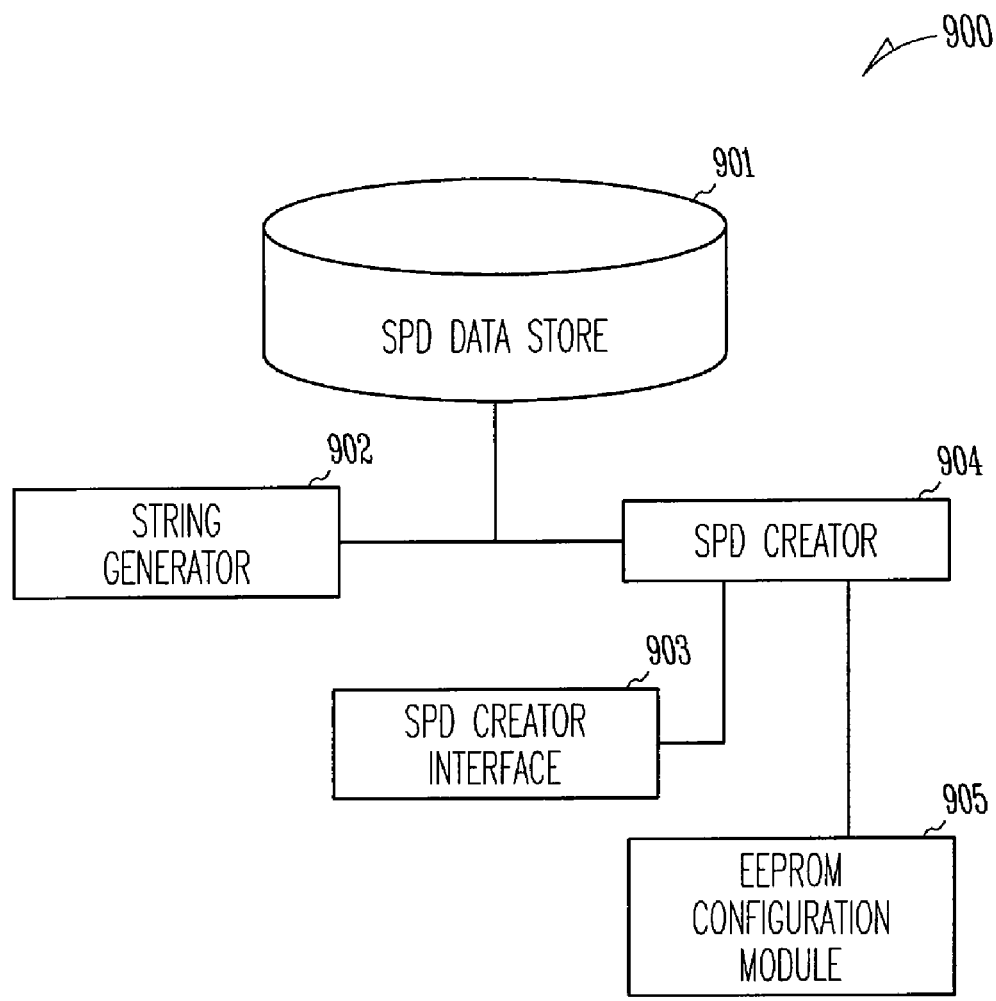
FIG. 9 is a diagram of another SPD content creation system.

FIG. 9 is a diagram of another SPD creation system 900. The SPD creation system 900 is implemented in a computer-readable and accessible medium and is accessible via any network. In one embodiment, the SPD creation system 900 embodies in whole or in part the processing of FIGS. 1-5 and can optionally consume the data structures of FIGS. 6-7. Moreover, the SPD creation system 900 need not be in operation, but when it is operational it automatically generates SPD contents for given memory modules.

The SPD creation system 900 includes a SPD data store 901, a SPD string generator 902, a SPD creation interface 904, and a SPD creator 905. Initially, a user interacts with the SPD creation interface 904 and supplies a memory module identifier and/or vendor identification. The SPD creation interface 904 supplies the memory module identifier to the SPD string generator 902. The string generator 902 searches the SPD data store 901 and acquires an SPD tokenized string for the supplied memory module identifier.

Next, the SPD string generator 902 transmits the SPD tokenized string to the SPD creator 904. The SPD creator 904 parses the SPD tokenized string to acquire a list of unique SPD tokens embedded therein. Next, the SPD creator 904 either issues a series of search requests to the SPD data store 901 for each unique SPD token or issues a single search request to the SPD data store 901 having all of the unique SPD tokens.

The SPD data store 901 response the search request(s) from the SPD creator 904 with an association for each unique SPD token. That association includes links between each unique SPD token vis-à-vis SPD rules and SPD values. The SPD creator 904 interprets and enforces the rules with respect to each association in order to acquire the proper SPD values. This processing continues until each of the associations is addressed by the SPD creator 904. Upon completion, the SPD creator 904 has created or generated specific SPD contents. The SPD contents represent needed information that needs programmed into or configured within an EEPROM, in order for that EEPROM to be processed by a processing device to configure the needed memory module within the processing device at start up or boot up.

In some embodiments, a particular rule that is successfully processed may indicate to the SPD creator 904 that a variety of SPD values can be acceptably used. In these situations, the SPD creator 904 can be preconfigured to resolve an acceptable SPD value or can contact the SPD creation interface 903 for assistance to acquire an acceptable SPD value from the user.

In one embodiment, the SPD creator 904 transmits a completed SPD contents to an EEPROM configuration module 905. The EEPROM configuration module 905 writes or configures the SPD contents into an instance of an EEPROM.

In one embodiment, the EEPROM configuration module 905 batches the supplied SPD contents and waits until a predetermined number of additional instances of SPD supplied contents are received from the SPD creator 904. When the predetermined number (threshold) is reached, the EEPROM configuration module 905 writes or configures the appropriate instances of SPD contents to appropriate instances of EEPROMs. In still another embodiment, the EEPROM configuration module 905 batches the SPD creator 904 supplied SPD contents and waits to configure an instance of an EEPROM with the SPD contents until a predefined event occurs. The event can be associated with a specific time of day, a specific calendar date, a specific manually supplied authorization, a specific automatically generated authorization, and the like.

Figure 10:
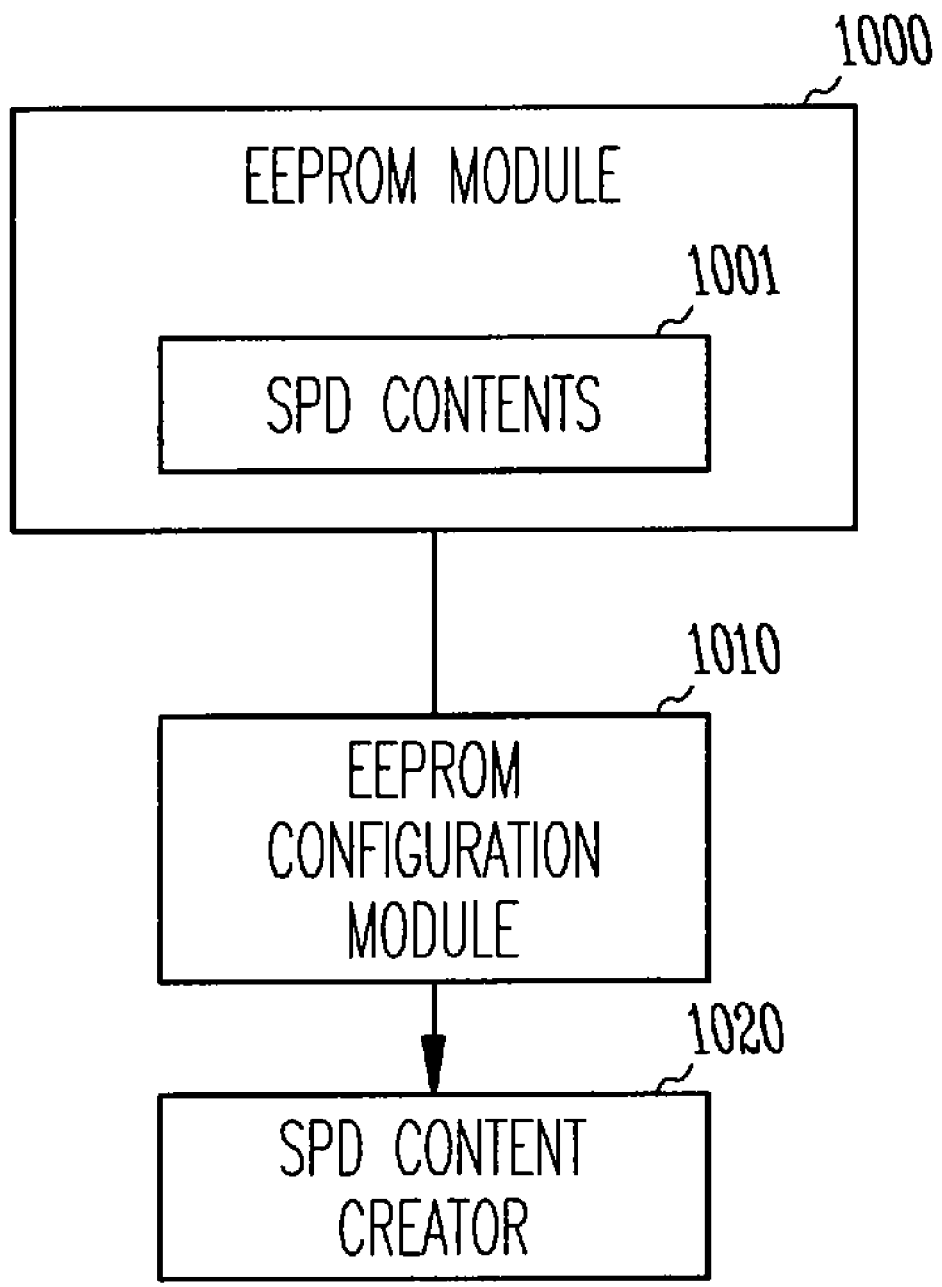
FIG. 10 is a diagram of an EEPROM on a memory module produced by various techniques of the invention.

FIG. 10 is a diagram of an EEPROM on a memory module 1000 (hereafter EEPROM 1000). The EEPROM 1000 conforms to industry standards in that it includes SPD contents 1001 which are expected by industry standards for generating SPD contents. However, the SPD contents 1001 of the EEPROM 1000 are generated using the methods, data structures, or systems presented with the teachings of this invention.

That is the SPD contents 1001 are automatically generated for a defined memory module based on an electronic and codified version of the industry standards. This codified version includes SPD tokens for industry standard variable parameters or sub-dependent variable parameters. Moreover, each SPD token is linked or otherwise associated with SPD rules; the SPD rules associated with one or more SPD values. A memory module identifier results in automatically generated SPD tokenized strings. Each token is mapped to select SPD rules and SPD values. When the SPD rules are dynamically and automatically interpreted or enforced, the needed SPD values are automatically acquired. The needed SPD values are organized in the correct format according to the standards and written or configured within the EEPROM 1000 of FIG. 10 as automatically generated SPD contents 1001.

In some embodiments, the EEPROM 1000 also includes an automatically generated label based on industry standards for label generation, as was discussed in detail above. In one embodiment, the SPD contents 1001 are automatically configured or written to the EEPROM 1000 by an EEPROM configuration module 1010 as discussed in detail above. The EEPROM configuration module 1010 acquires the SPD contents 1001 from a SPD content creator 1020. The features and processing of a SPD content creator 1020 were also described in detail above.

CONCLUSION

Embodiments of the present invention teach methods, data structures, systems, and EEPROMs where SPD contents are automatically generated. The SPD contents define configuration information for instances of memory modules. The SPD contents can then be configured within an EEPROM and shipped for installation in one or more computing or processing devices or installed within one or more computing devices which are then shipped. Conventional, manually intensive efforts were needed to generate instances of SPD contents. This can now be avoided with the teachings presented herein and above.

Moreover, the teachings presented herein can be extended to any industry standard, such that interfaces and processing techniques presented herein can be modified and used to automatically define and generate individual instances of contents for data structures defined by that industry standard. Thus, the invention is not limited to JEDEC standards for SPD contents. Furthermore, in some instances, the invention is not limited to automatically generating SPD contents for EEPROM.

In fact, in some embodiments, different standards can be used to render SPD contents or any other types of contents into desired formats required by different devices, services, or protocols. In this sense, the invention presents techniques for consuming a codified standard and rendering specific values for variables of that standard into data formats that are desired. In some cases the rendered data formats are in an XML format and capable of being dynamically consumed or dynamically rendered via an associated XML schema. Accordingly, all such extensions are intended to fall within the generous scope of the present invention.

The above description is illustrative, and not restrictive. Many other embodiments will be apparent to those of ordinary skill in the art upon reviewing the above description. The scope of embodiments of the invention should therefore be determined with reference to the appended claims, along with the full scope of equivalents to which such claims are entitled.

The Abstract is provided to comply with 37 C.F.R. § 1.72 (b) requiring an Abstract that will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject mater lies in less than all features of a single disclosed embodiment. Thus the following claims are hereby incorporated into the Description of the Embodiments, with each claim standing on its own as a separate exemplary embodiment.

What is claimed is:

1. A Serial Presence Detect (SPD) data structure residing in a machine-accessible medium to configure a memory module of a machine, the SPD data structure comprising:
   a plurality of SPD tokens logically associated with one another in a string format;
   a plurality of SPD values, wherein each unique SPD value is linked to a particular one of the SPD tokens within the string format; and
   a plurality of rules, wherein each rule is associated with a particular linked SPD token-value pair;
   wherein the machine when initiated is to parse the SPD tokens acquire the SPD values and enforce the rules to configure a memory module within the machine for use.

2. The SPD data structure of claim 1, wherein the SPD tokens are mapped to an industry parameter name associated with an attribute of the memory module.

3. The SPD data structure of claim 1, wherein the rules are selected and driven by the machine in response to the SPD values and the SPD tokens.

4. The SPD data structure of claim 1, wherein the rules are acquired by the machine from a data store.

5. The SPD data structure of claim 1, wherein the string format is indexed and stored in a data store in response to an identifier for the memory module.

6. A Serial Presence Detect (SPD) data structure residing in a machine-accessible medium to configure a memory module of a machine, the SPD data structure comprising:
   a tokenized string having a plurality of tokens and values that accompany the tokens, each token-value pair within the tokenized string representing a configuration attribute and setting for a memory module to which the tokenized string is associated; and
   rules that are to be processed by the machine in response to each token-value pair to configure the memory module within the machine for subsequent use.

7. The SPD data structure of claim 6, wherein each token-value pair is arranged within the tokenized string in at least one of an order-dependent manner and an order-independent manner.

8. The SPD data structure of claim 6, wherein the tokens are represented in an Extensible Markup Language (XML) data format.

9. The SPD data structure of claim 6, wherein the tokenized string is associated with an identifier and the identifier also uniquely identifies the memory module.

10. The SPD data structure of claim 9, wherein the tokenized string is indexed into a data store using the identifier.

11. The SPD data structure of claim 9, wherein the rules are to be processed when the machine is initiated or started.

12. A Serial Presence Detect (SPD) data structure residing in a machine-accessible medium to configure a memory module of a machine, the SPD data structure comprising:
    a plurality of SPD tokens;
    a plurality of values associated with an industry standard for SPD content generation;
    a plurality of rules for selecting select ones of the values; and
    a plurality of links that associate the SPD tokens, the values, and the rules;
    wherein the rules are processed by the machine to configure the memory module for use within the machine.

13. The SPD data structure of claim 12, wherein instances of the data structure are indexed and housed in a data store.

14. The SPD data structure of claim 12, wherein a specific instance of the data structure define specific SPD contents for a specific memory module.

15. The SPD data structure of claim 12, wherein instances of the data structure are consumed by an SPD content creator, wherein the SPD content creator generates SPD contents for Electrically Erasable Programmable Read-Only (EEPROMs) on memory modules.

16. A Serial Presence Detect (SPD) data structure residing in a machine-accessible medium to configure a memory module of a machine, the SPD data structure comprising:
    a plurality of tokenized SPD strings; and
    rules that are selectively linked to each tokenized SPD string;
    wherein the machine is to selectively acquire a particular one of the tokenized SPD strings in response to an identifier associated with a memory module, and wherein the machine is to acquire the corresponding linked rules and enforce those rules to configure the memory module within the machine for use.

17. The SPD data structure of claim 16, wherein each tokenized SPD string further includes a plurality of SPD token-value pairs, and wherein each SPD token-value pair corresponds to a configuration attribute name for a memory module to which it relates and a corresponding setting.

18. The SPD data structure of claim 16, wherein the machine is to use the identifier as a search of a data store to acquire the particular one of the tokenized SPD strings.

19. A Serial Presence Detect (SPD) data structure residing in a machine-accessible medium to configure a memory module of a machine, the SPD data structure comprising:
    an identifier for a memory module;
    a plurality of SPD token-value pairs associated with the identifier; and
    one or more rules associated with each SPD token-value pair;
    wherein the machine at startup acquires the identifier from the memory module installed in the machine and uses the identifier to locate the plurality of SPD token-value pairs and parses each SPD token-value pair to process the one or more rules for purposes of configuring the memory module for use within the machine.

20. The SPD data structure of claim 19, wherein the plurality of SPD token-value pairs are acquired from a data store using the identifier as a search term.

21. The SPD data structure of claim 19, wherein the plurality of SPD token-value pairs are at least one of order independent and order dependent.

22. The SPD data structure of claim 19, wherein each SPD token-value pair includes a link to a select one of the one or more rules.

* * * * *